United States Patent [19]

Boelart

[11] Patent Number: 5,144,430
[45] Date of Patent: Sep. 1, 1992

[54] DEVICE AND METHOD FOR GENERATING A VIDEO SIGNAL OSCILLOSCOPE TRIGGER SIGNAL

[75] Inventor: Eduardo I. Boelart, Buena Park, Calif.

[73] Assignee: North American Philips Corporation, New York, N.Y.

[21] Appl. No.: 742,992

[22] Filed: Aug. 9, 1991

[51] Int. Cl.$^5$ .............................................. H04N 17/00
[52] U.S. Cl. .................................. 358/139; 324/121 R
[58] Field of Search ........................... 458/139, 10, 183; 324/121 R

[56] References Cited

U.S. PATENT DOCUMENTS

| 3,742,132 | 6/1973 | Olsson | 358/113 |
| 3,798,366 | 3/1974 | Hunt | 358/113 |
| 4,743,845 | 5/1988 | Diller | 324/121 R |
| 4,763,067 | 8/1988 | Fladstol | 324/121 R |

Primary Examiner—Howard W. Britton

[57] ABSTRACT

A sync separator separates vertical, field and horizontal synchronization signals from a video signal processed by a circuit under test which exhibits an artifact in the video. The cause of the artifact in the circuit under test is to be located using an oscilloscope. A line select circuit includes a delay responsive to the separated vertical and field signals for generating a marker signal and for positioning the marker signal via observation of the display produced by video signal under test. A trigger signal and marker generator refines the marker signal by causing the boundaries of the marker signal to coincide with corresponding horizontal sync pulses and produces an oscilloscope trigger signal having a transition which is formed by one of those boundaries. A combiner circuit combines the refined marker signal with the video signal under test for display so that the marker signal via the delay can be positioned on a region of interest in the video display. The trigger signal triggers the oscilloscope so that the oscilloscope displays the portion of the video defined by the so positioned marker signal.

21 Claims, 4 Drawing Sheets

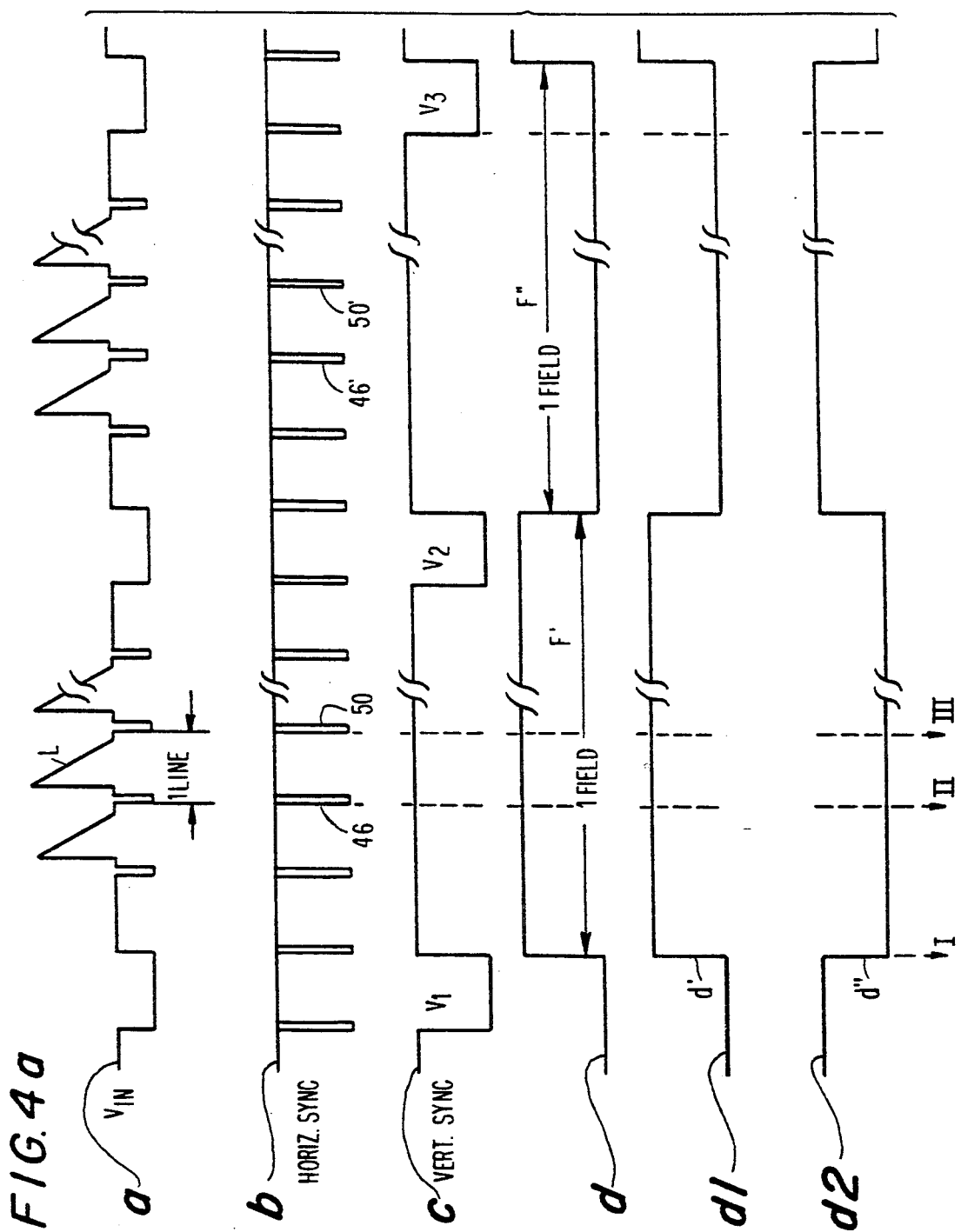

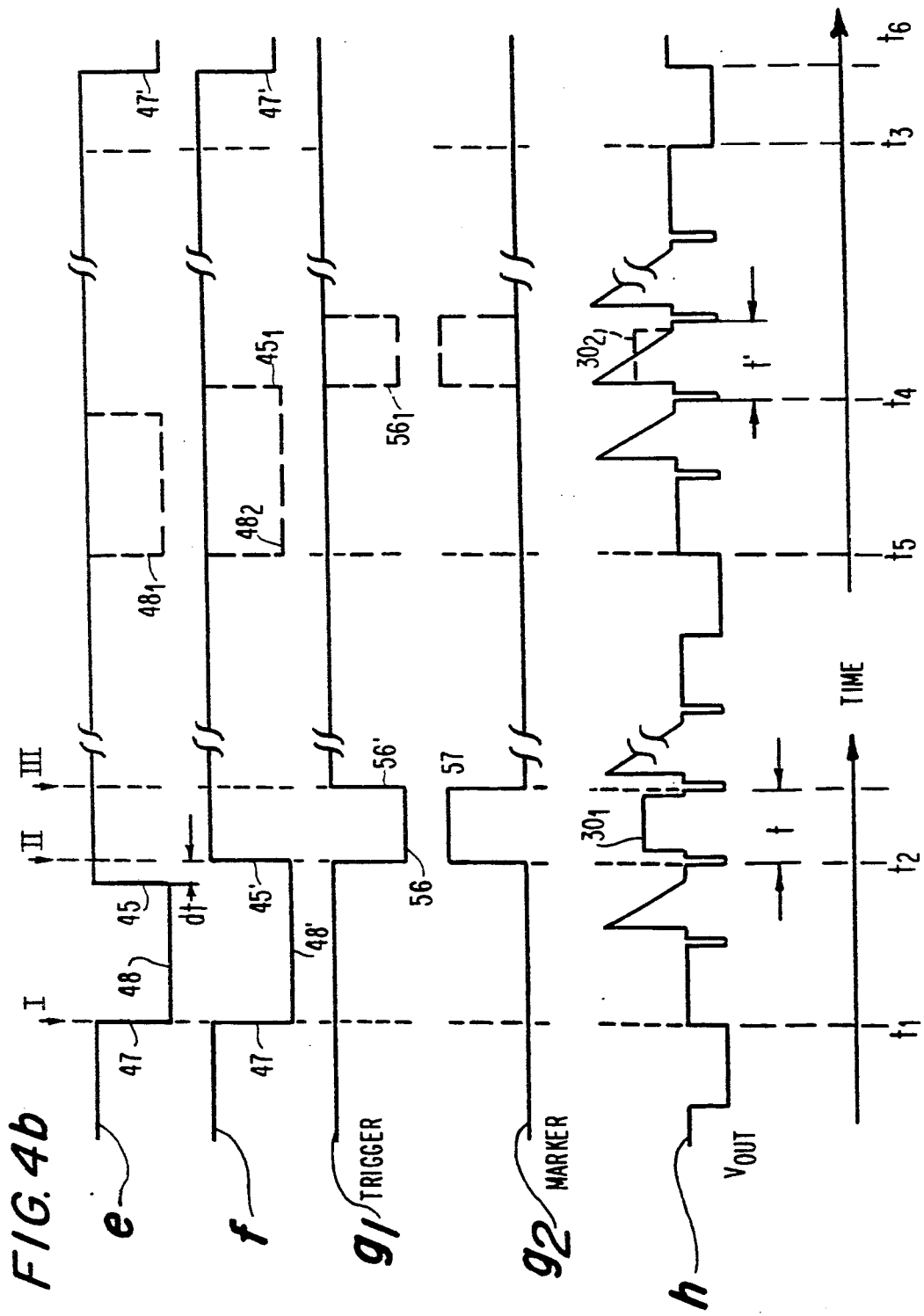

DEVICE AND METHOD FOR GENERATING A VIDEO SIGNAL OSCILLOSCOPE TRIGGER SIGNAL

FIELD OF THE INVENTION

This invention relates to a device and method for generating an oscilloscope trigger signal for use in observing on the oscilloscope one or more video signal scan lines.

BACKGROUND OF THE INVENTION

Video circuits are used in conjunction with video display systems in which a raster scan video display comprises a plurality of raster scan lines. Typically such a display comprise a plurality of successively displayed frames wherein each frame comprises a pair of successive fields. A frame in the United States comprises 525 scan lines and a field comprises 262.5 scan lines. The fields are each defined by a vertical synchronization signal and each scan line is defined by a horizontal synchronization signal.

Often, problems arise in the video generating and display circuits. Some of these problems appear as undesired artifacts in a portion of the visual display. Others of these problems may appear which undesirably affect the entire display. In addressing these problems the service technician typically employs an oscilloscope to display the circuit waveforms at selected points in the circuit in an attempt to isolate the cause of the displayed problem which appears on the video monitor, receiver and so on. To do this, the test points of the circuit provide vertical and horizontal components of the oscilloscope display. A trigger signal is also supplied the oscilloscope as part of the oscilloscope operation.

The trigger signal is intended to permit display on the oscilloscope display a given portion of the waveform to be analyzed. The problem with displaying a video signal on an oscilloscope, as recognized by the present inventor, is the lack of a reliable trigger signal source for isolating a given portion of a video signal. Typically the oscilloscope displays too much of the video signal so as to be substantially of little value in isolating a particular cause of a video display problem. Trigger signal generating devices are available but these usually have fixed delay relative to a reference, for example, the vertical sync signal. This fixed delay results in the trigger signal being based on an arbitrary portion of a video signal which may vary in amplitude and therefore cause loss of the trigger signal or, at best, cause jitter in the display of the oscilloscope. Further, more importantly, the defective portion of a video signal, i.e., the portion exhibiting an artifact, caused by a defective video circuit portion may or may not be included in the oscilloscope display initiated by that trigger signal generating device.

SUMMARY OF THE INVENTION

The present inventor recognizes a need for a device and methodology for reliably and repeatedly identifying and isolating a portion of a video display signal for observation on an oscilloscope regardless where in the video signal that portion may lie.

In accordance with an embodiment of the present invention, a device for generating an oscilloscope trigger signal for use in observing on an oscilloscope a selected portion of a plurality of raster scan lines of a video signal applied to the oscilloscope, each scan line having a given length defined by the horizontal synchronization (sync) pulses of the video signal, comprises means responsive to the video signal applied as an input thereto for generating a video display marker signal corresponding to and manifesting the length and time of occurrence of the selected corresponding portion. Means responsive to the video signal applied as an input thereto generate an oscilloscope trigger signal manifesting the time of occurrence of the selected portion. As a result, a technician can visually select the portion of the video display, for example a given scan line, to be analyzed by the oscilloscope, cause a marker signal to be generated to coincide with the portion of the display of interest and cause a trigger signal to be generated which coincides with the portion identified by the marker signal.

IN THE DRAWING

FIGS. 4a and 4b are timing diagrams illustrating waveforms at different points in the circuit of FIG. 3 useful for explaining the principles of the present invention.

DESCRIPTION OF THE PREFERRED EMBODIMENT

Figure 1:
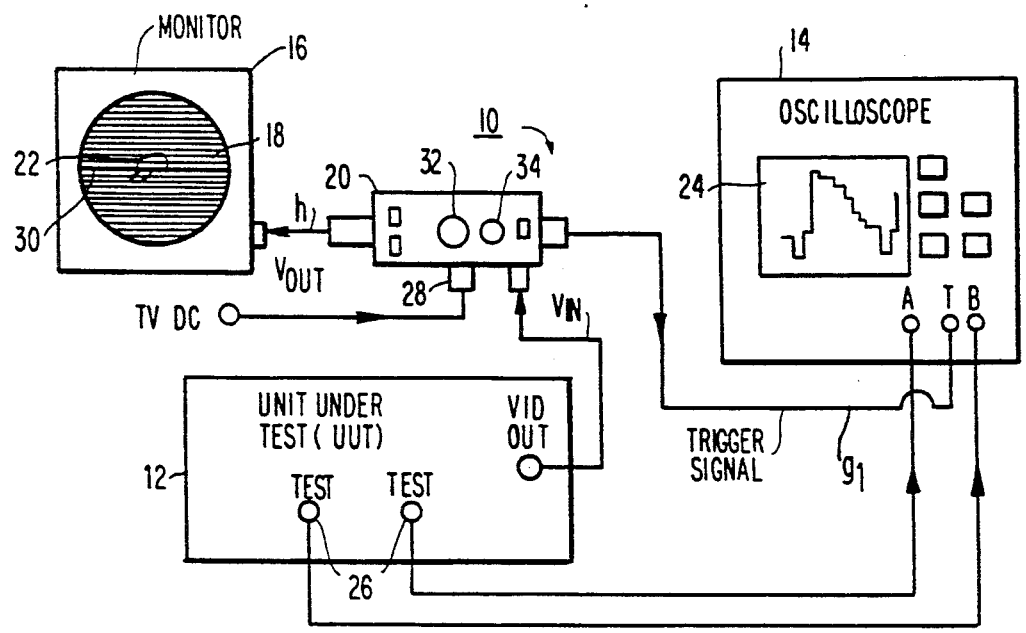
FIG. 1 is schematic diagram of a system employing a device according to one embodiment of the present invention for analyzing a unit under test (UUT) with an oscilloscope and video monitor.

In FIG. 1, a test system 10 for servicing a UUT 12, which is a video circuit for processing a video signal, includes an oscilloscope 14, a video monitor 16 for generating a video display 18 and a trigger signal generating device 20 according to the present invention. The display 18 generated by the UUT 12 is a raster scan comprising two interlaced fields of 262.5 lines forming a video frame of 525 lines. The video display 18 by way of example, exhibits an undesired artifact 22. It is desired to check the circuits of the UUT 12 at different points to determine the cause of the artifact 22. Prior art accessories for use with the oscilloscope are for general use and do not lend themselves to easily causing the oscilloscope to display a waveform corresponding to a selected portion of the video display 18, for example at artifact 22, to enable a technician to diagnose the circuits of the UUT generating that portion of the display at artifact 22.

The test points 26 of the UUT 12 are connected to the respective A and B inputs of the oscilloscope for displaying on display 24 the waveform generated at points 26 in a known way. A video signal $V_{in}$ which generates display 18 is applied from an output $VID_{OUT}$ of UUT 12 to video signal input terminal 40 of the device 20. A +DC power supply voltage is applied to device 20 at terminal 28. A video signal reference marker line signal is generated and superimposed on the video signal $V_{in}$ by device 20. The superimposed marker signal produces a marker line 30 on the display 18. The marker line is caused by the operator to coincide with a selected scan line of display 18. The selected scan line may comprise a single scan line of one field or, more typically, two adjacent scan lines of successively occurring fields in a selected frame. The term scan line as used in herein includes at least one scan line in at least one field.

The reference marker line 30 appears on the display 18 as a white blank line readily observable on the display 18. The line 30 is exactly one or more scan lines in length terminating at selected horizontal synchronization (sync) pulses of the video signal. If more than one scan line in length, the marker line 30 extends to two adjacent scan lines in adjoining fields of a frame to form a composite two scan line width reference line 30 on the display 18. The signal generating the marker line 30 is combined with the video signal $V_{in}$ by device 20. Potentiometer 32 coupled to the circuit (to be described below) of the device 20 adjusts the position of the marker line 30 on the display 18 so as to coincide with a desired portion of the display such as at artifact 22. A potentiometer 34 adjusts the brightness of the reference marker line 30.

The device 20 generates a trigger signal $g_1$ on output terminal 35 which is applied to the trigger input T of the oscilloscope 14. A predetermined transition of the trigger signal as set by controls of typical oscilloscopes coincides exactly with the beginning of the reference marker line 30, e.g., the horizontal sync pulse defining the beginning of that line. Therefore, the oscilloscope is triggered exactly at that portion of the video signal marked by the reference marker line 30. Consequently, a technician always knows what portion of the video signal is being displayed at all times by the oscilloscope 14 and can quickly and reliably analyze the waveform on the oscilloscope display for cause and effect relative to the artifact 22 appearing on the display 18. If the waveform on the oscilloscope display 24 appears normal, the operator can then relocate the test points 26 to a different portion of the UUT 12 to search for the cause of the artifact 22. The technician can then concentrate on locating the defective portion of the circuit of the UUT without the added problem of jitter, loss of the oscilloscope display signal or the difficult task of resolving an oscilloscope display of the entire frame of a video signal as occurs with prior systems.

Figure 2:
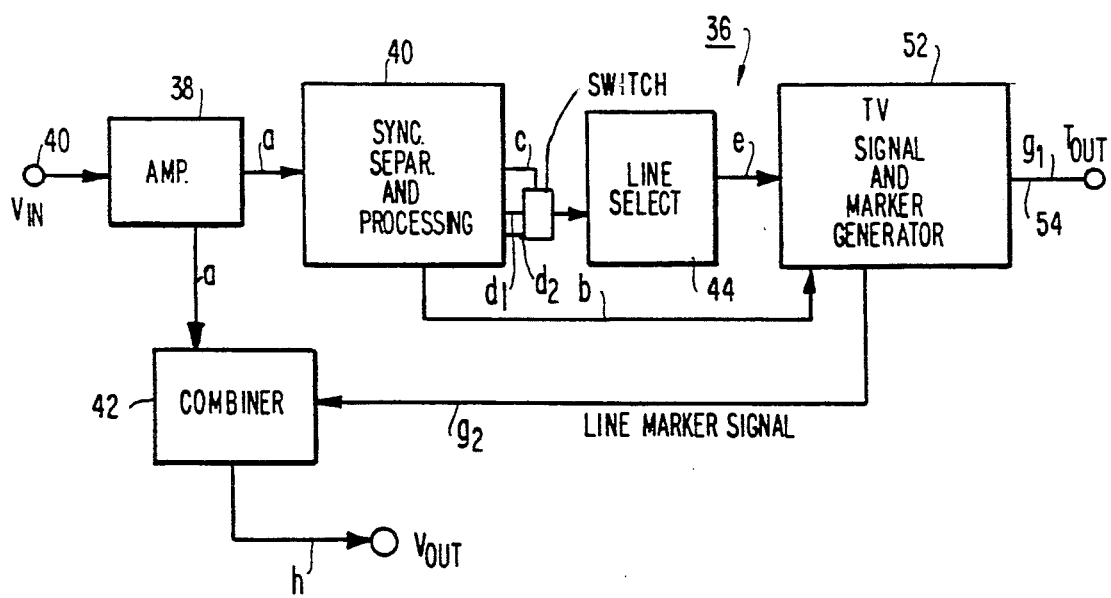
FIG. 2 is a circuit schematic diagram of the device constructed and operated according to the present invention.

In FIG. 2, circuit 36 of device 20 includes a video signal amplifier 38 for amplifying the input signal $V_{in}$ applied to terminal 40. The amplified video signal $V_{in}$, waveform a, FIG. 4, is applied to sync separator and processing circuit 40 and combiner circuit 42. Circuit 40 separates the horizontal synchronization pulses, waveform b, FIG. 4a, the vertical synchronization pulses, waveform c, pulses d', waveform $d_1$ and pulses d", waveform $d_2$, from the video signal $V_{in}$, waveform a. The pulses d' and d" comprise field synchronization pulses in which pulse d' manifests one field and pulse d" manifests the other successively occurring field of a frame. Switch S comprises an arrangement for selectively applying vertical sync pulses c or field sync pulses d' or d" to line select circuit 44. Combiner circuit 42 combines the line marker signal $g_2$ with the video signal $V_{in}$, waveform a, superimposing signal $g_2$ on the video signal to produce display 18 with the marker line 30.

The line select circuit 44 is responsive to a selected one of the vertical sync signal c, the field sync signal d' and the field sync signal d". Depending on the switch position of the switches S1, S2, S3 and S4 (FIG. 3) of switch S, a line is selected for one of the two adjacent fields or adjacent scan lines in adjacent fields of a frame. The line select circuit 44 positions the reference marker line 30 anywhere within one or two fields as selected. If the vertical sync pulses c are applied to circuit 44 then the reference marker signal is generated for two successive fields of a frame at adjacent scan lines. Depending on whether signal $d_1$ or $d_2$ is selected determines which one of two adjacent fields are to be to be selected. That is, the reference marker line signal may be generated by a selected pair of vertical sync pulses, for example, pulses $V_1$ and $V_2$, waveform c, when switch S2 is in the auto mode and, therefore, is generated in each field of a selected frame. In the alternative, with switch S2 in the MAN mode, a field signal $d_1$ or $d_2$ is selected via switch S3 which causes a marker line signal to be generated for a selected field of a frame. In any case, circuit 44 serves to select a scan line anywhere in a field by permitting the operator to position the marker line 30 anywhere in one or both of two adjacent fields. As a result, a selected scan line or lines, as the case may be, of the two fields are adjacent to each other in the display.

In FIG. 4b, the line select circuit 44 generates a pulse signal, waveform e, whose transitions define a first pulse 48. One transition 47 is fixed in time $t_1$, for example, and the other transition 45 is moveable in time anywhere in a field, as defined for example by the field of pulse d', waveform $d_1$. A selected one of the positive going transitions of waveforms c, $d_1$ or $d_2$ as occurs at time $t_1$ cause the transition 47 to occur, waveform f, and thus fix its time of occurrence. The transition 45 of pulse 48 is moved about in field $d_1$ to select a given line to be marked by the marker signal, for example, scan line L FIG. 4a, waveform a. However, while the selected position of transition 45 in a field corresponds to the selected scan line, transition 45 does not coincide in time, for example time $t_2$, with a horizontal sync pulse, e.g., pulse 46, defining that scan line. This lack of time coincidence is illustrated by period $d_t$ between transition 45 and the time $t_2$ of occurrence of the next occurring horizontal sync pulse 46. The pulse 48 transition 45 leads that next occurring horizontal sync pulse 46 by the period $d_t$. The time period $d_t$, while relatively short, is significant because the trigger and line marker signals must coincide exactly with a horizontal sync pulse, which transition 45 does not. Potentiometer 32 (FIG. 1) adjusts the position of transition 45. This positioning action of transition 45 is a first step in positioning and creating the marker line and the trigger signals.

Figure 3:
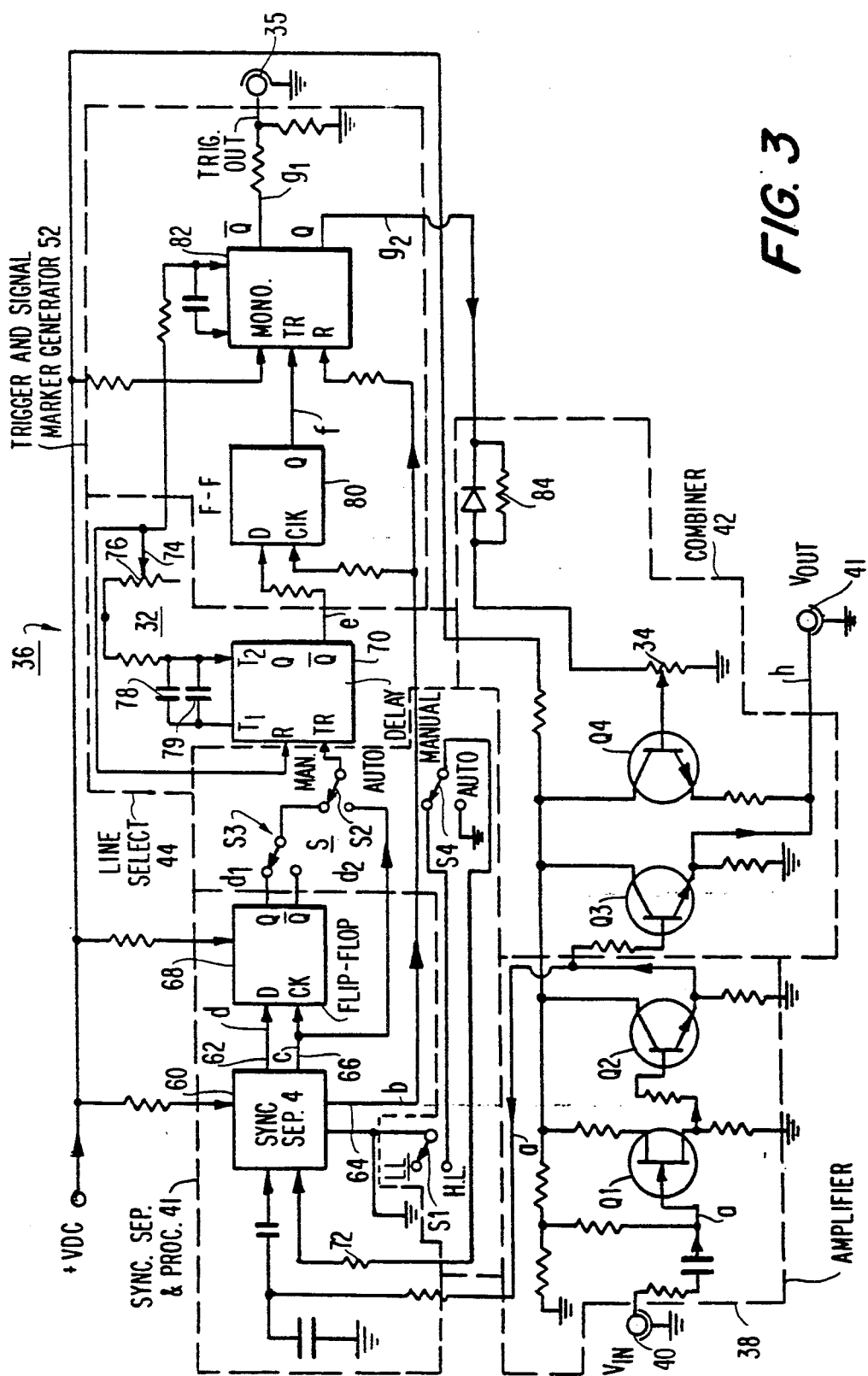
FIG. 3 is a circuit diagram showing the circuit of FIG. 2 in more detail.

Signal e, pulse 48, is applied to trigger signal and marker generator 52. Generator 52, in response to the applied pulse 48 of signal e and to the next occurring horizontal sync pulse 46, causes the pulse 48 transition 45 to be replaced by transition 45', waveform f, exactly in time coincidence with a selected horizontal pulse, e.g., pulse 46. Since there is only one positive going transition in either of the waveforms $d_1$ and $d_2$ at respective times $t_1$ and $t_5$ in the frame defined by periods $t_1$ and $t_3$, only one pulse 48 is generated in this period as determined by the switch position of switch S switches S1 and S2 as shown in FIG. 3. If the switch S2 is on auto, then the vertical sync pulses $V_1$ and $V_2$, each exhibiting a positive going transition in this period at times $t_1$ and $t_5$, results in two pulses 48 and $48_1$ being generated, the pulse $48_1$ being shown in phantom. This is in accordance with whether one scan line or two adjacent scan lines of successive fields of a frame are selected. Generator 52, FIG. 2, in response to the positive going transition 45' of pulse 48' waveform f, outputs on output 54 terminal 35 signal $g_1$ trigger pulse 56 which is of one scan line duration. As shown in FIG. 4, the transitions of the pulse of signal $g_1$ coincide exactly with adjacent horizontal sync pulses 46 and 50. In triggering the oscilloscope, only one of the transitions of signal $g_1$ pulse 56 is used. For example, positive going transition 56' triggers the oscilloscope in this example. The oscilloscope could be triggered by the negative or positive going transitions in accordance with the oscilloscope setting. The line marker signal $g_2$ is the inverse of pulse 56 and, therefore, also inherently defines the position in time of scan line L.

In the situation where waveform c pulses $V_1$ and $V_2$ are used to generate two trigger signals, 56' and $56_1$, then pulse $48_1$ results in the generation of pulse $48_2$ which corresponds to pulse 48' and horizontal sync pulse 46'. Pulse 50' defines the time of the leading edge $45_1$ of pulse $48_2$. Leading edge $45_1$ results in the generation of trigger pulse $56_1$ at time $t_4$ and line marker signal $30_2$. The line marker signals $30_1$ and $30_2$ correspond to adjacently generated scan lines in successive fields on the display 18 represented by marker line 30, FIG. 1.

The marker signal $g_2$ is then combined with signal a to produce the combined output signal $V_{out}$ at terminal 41, FIG. 2. The combined signal appears as shown by waveform h in which the video signal $V_{out}$ is blanked in period t for the duration of one scan line, in this example, in which a scan line of one field is selected for display on the oscilloscope. The signal $V_{out}$ is also blanked in period t' as shown by signal $30_2$ in the case two scan lines are marked in adjoining fields F' and F'''.

In FIG. 3, one example of the circuit of FIG. 2 is illustrated in more detail wherein sync separator and processing circuit 40 of circuit 36 comprises an integrated circuit sync separator circuit 60 commercially available as model LM 1881. Circuit 40 generates waveforms b, c and d. The separator circuit 60 provides pulses on output 62 manifesting each field, waveform d, FIG. 4. The separated horizontal sync pulses, waveform b, are applied to output 64. The separated vertical sync pulses, waveform c, are applied to output 66.

The field pulses d of output 62 are applied to the D input of a JK flip-flop (FF) 68 and the vertical sync pulses c at output 66 are applied to the clock input of FF 68. FF 68 may be, for example, one flip-flop of a a dual D flip-flop with set/reset type ECG 4013 available as an integrated circuit. The Q output of flip-flop 68 produces waveform $d_1$ and the $\overline{Q}$ output produces the inverse waveform $d_2$ which are respectively applied to different terminals of dual pole, single throw switch S3 whose wiper arm is connected to one terminal MAN of dual pole, single throw switch S2. A second terminal AUTO of switch S2 is connected to output 66 of circuit 60 to receive the vertical sync pulses c. The wiper arm of switch S2 is connected to the trigger (TR) input of delay 70.

A dual pole, single throw switch S1 wiper arm in a first position couples pin 4 of the LM 1881 sync separator circuit 60 to switch S1 open at terminal L.L. to cause the vertical sync pulses to correspond to what is known as low line (L.L.) or normal 525 lines of video per frame. In a second position, the wiper arm of switch S1 couples pin 4 of circuit 60 to terminal H.L. Terminal H.L. is connected to terminal MAN of double pole, single throw switch S4 whose wiper arm is connected to pin 6 of the LM 1881 circuit 60 via a current limiting resistance 72. The latter switch positions correspond to 1049 lines of video for special video circuits having this resolution. In the AUTO position of switch S4, pin 6 of circuit 60 is coupled via terminal AUTO to ground potential. In the high line (H.L.) position of the switch S1, switches S2 and S4 are placed in the MAN position. When so placed, switch S3 manually selects one of the Q and $\overline{Q}$ outputs of FF 68 to select a given field to be marked by a marker line. In the position shown for the switches, the MAN position of S4 is not used since S1 is in the L.L. position corresponding to 525 lines of video. In the position of S2 and S3 as shown, a given field represented by waveform $d_1$ is selected to be marked. With S2 in the MAN position the other field waveform $d_2$ may be selected by switch S3 when desired.

The MAN position of the switches thus selects one of the field sync pulses signals $d_1$ or $d_2$ to cause the marker signal to correspond to a scan line of the selected field.

In the AUTO mode of the switches, The vertical c pulses are applied to the trigger input TR of delay 70 causing the marker signal to occur in two adjacent scan lines of adjacent fields represented by signals $d_1$ and $d_2$. This latter mode is preferable for most test situations.

Delay 70 comprises a settable monostable multivibrator, which may be an integrated circuit commercially known as a 4098 circuit. The reset input R of delay 70 is coupled to potentiometer 32 wiper arm 74, which is coupled to the VDC source. Transition 47 of pulse 48 produced at the $\overline{Q}$ output of delay 70 (waveform f, FIG. 4b) is produced in response to a positive going transition on the circuit 70 TR input of the applied selected one of the c, $d_1$ and $d_2$ signals. Thus the time of occurrence of transition 47 is determined by that positive going transition. Recall that the time of occurrence of the other pulse 48 transition 45 is set by the potentiometer 32 position. Resistance 76 of potentiometer 32 is coupled to the T1 and T2 inputs of the circuit 4098 via parallel capacitors 78 and 79 to permit operation of the circuit with both 50 and 60 Hz line frequencies. The pulse duration of pulse 48 as determined by the position of transition 45 is thus settable in accordance with the setting of potentiometer 32. The position of the transition 45 thus determines the position of the ensuing trigger and marker pulses 56 and 57, respectively, waveforms $g_1$ and $g_2$, whose position in time is determined by the position of transition 45.

Because pulse 48 transition 45 is manually moved by potentiometer 32, it is difficult to manually place the transition 45 exactly in time coincidence with a selected horizontal sync pulse such as pulse 46 corresponding to a selected scan line L. As a result there typically is a slight delay $d_t$ discussed previously between transition 45 and pulse 46. This offset of pulse 48 transition 45 from a horizontal sync pulse time of occurrence is undesirable and needs to be corrected because the goal is to generate a marker signal and an oscilloscope trigger signal that exactly corresponds to an entire scan line so that the UUT can be correctly analyzed. The functions of moving the transition to time coincidence with a horizontal sync pulse and for generating the trigger and marker respective pulses 56 and 57 are performed by generator 52, and in particular, by JK flip-flop (FF) 80 and monostable multivibrator 82 comprising generator 52.

FF 80 may comprise the other flip-flop of the dual flip flop circuit ECG4013. The FF 80 clock input receives the horizontal sync pulses b and the D input receives the pulses 48 waveform e from delay 70. The repositioned transition 45' of pulse 48 appears on pulse 48' produced on the Q output of FF 80. Waveform e sets FF 80 when pulse 48 goes high at the time of occurrence of transition 45. The next occurring horizontal sync pulse 46 sets the FF 80 Q output, waveform f, high at time $t_2$, forming transition 45'. Thus transition 45' is concurrent with a horizontal sync pulse. e.g., pulse 46. When waveform e goes low, for example at time $t_6$, the Q output also goes low, creating a transition 47' corresponding to transition 47, commencing the generation of the next trigger and marker line pulses.

The waveform f signal is applied to the trigger TR input of monostable multivibrator 82, which also may be 4098 circuit, whose reset input R receives the horizontal sync pulses The Q output, waveform $g_2$, is set high by transition 45'. The Q output is then reset low when horizontal sync pulse 50 (waveform b) is applied to the reset input R forming pulse 57. The $\overline{Q}$ output of multivibrator 82 is waveform $g_1$ which is the oscilloscope trigger signal and the Q output is the line marker reference signal $g_2$. As described above, the transition 56' (waveform g1) of the trigger pulse 56 is selected to trigger the oscilloscope whereas the entire length of the trigger pulse inverted forms the marker signal. The multivibrator 82 in essence forms the transition 56' in time coincidence with the next occurring horizontal sync pulse 50.

The marker reference signal $g_2$ is applied to parallel diode-resistor circuit 84 so that the negative pulse of the marker signal is applied to the control electrode of NPN transistor Q4 via potentiometer 34. Potentiometer 34 sets the intensity of the marker signal applied to transistor Q4. The collector of transistor Q4 is coupled to the VDC source and the emitter is coupled to terminal $V_{out}$. The base electrode of NPN transistor Q3 is coupled to the output of amplifier 38. The emitter of Q3 is connected to the emitter of transistor Q4. The video signal applied to transistor Q3 is combined with the marker signal applied to Q4 to produce a combined signal $V_{out}$ on terminal 41.

In operation, the video signal $V_{in}$ under evaluation is applied to the device 20 terminal 40 and the test points 26 of the UUT 12 connected in circuit to the oscilloscope 14. The display 18 is observed and the marker line manually set by potentiometer 32 to coincide with either a single or two adjacent field scan lines by setting the switches S2 and S4, in the manual or auto mode as desired. Switches S2 and S4, in the alternative, may be a double throw, four pole switch. The potentiometer 32 is adjusted to move the reference mark in the display 18 until it coincides with a region of interest in the display. With the marker intensity set by potentiometer 34 as desired, the trigger signal $g_1$ is applied to the oscilloscope which is set to trigger on the appropriate transition of the trigger signal. The oscilloscope display is analyzed and where necessary, the test points relocated until the oscilloscope display 24 indicates that the selected test points identify the circuit portion sought as a cause of the artifact 22.

While scan lines have been illustrated, it should be apparent that the marker may represent portions less than or greater than a given scan line and the trigger signal set accordingly. This may be done by delaying these signals with appropriate delays so that the trigger and marker signals cover a region of interest. The display 18 gives a good visual indication as to exactly where in the video display the marker is positioned and, because the trigger signal is derived from the marker, also automatically locates the trigger signal at the marker so positioned. As a result, a valuable tool is provided for evaluating video circuits quickly and reliably.

What is claimed is:

1. A device for generating an oscilloscope trigger signal for use in observing on an oscilloscope a selected portion of a plurality of raster scan lines of a video signal applied to said oscilloscope, each said scan lines having a given length defined by the horizontal synchronization (sync) pulses of said video signal, said device comprising:
   means responsive to said video signal applied as an input thereto for generating a video display marker signal corresponding to and manifesting the length and time of occurrence of the selected corresponding portion of said lines; and
   means responsive to said video signal applied as an input thereto for generating an oscilloscope trigger signal manifesting the time of occurrence of said selected portion.

2. The device of claim 1 wherein said means for generating the marker signal includes means for causing said marker signal to manifest a raster scan line occurring in a video field.

3. The device of claim 1 wherein said means for generating the marker signal includes means for causing said marker signal to manifest a raster scan line occurring in successively occurring fields in a video frame.

4. The device of claim 1 wherein said selected portion is at least one scan line, said means for generating said marker signal including means for causing said marker signal to manifest said at least one video raster scan line and including delay means for selectively delaying the occurrence of said generated marker signal in time coincidence with said at least one scan line.

5. The device of claim 1 wherein said portion manifests at least one selected scan line, said video signal including vertical synchronization pulses, said means for generating said marker signal includes means responsive to said vertical pulses for generating a delayed line signal having a time duration greater than that of said at least one selected scan line, means for positioning said delayed line signal anywhere in time between adjacently occurring vertical pulses and means responsive to successively occurring horizontal sync pulses for making the time duration of said delayed line signal the same as that of said at least one selected line.

6. The device of claim 1 wherein said means for generating said trigger signal includes means for separating said horizontal sync pulses from said video signal and means responsive to said separated pulses applied thereto for generating said trigger signal in time coincidence with at least one of said separated sync pulses.

7. The device of claim 6 wherein said said line marker signal has leading and trailing edges, said means for generating said line marker signal includes means responsive to said horizontal sync pulses for causing said line marker signal leading and trailing edges to coincide in time with a different horizontal sync pulse.

8. The device of claim 1 including means for combining said generated marker signal with said video signal to produce an output video signal including said reference marker signal for visually identifying said selected at least one line in a display corresponding to said video signal.

9. The device of claim 7 wherein said means for making the time duration of said delayed line signal the same as said at least one selected line includes a flip flop responsive to said horizontal pulses and to said delayed line signal for causing the trailing edge of said delayed line signal to substantially coincide in time with a first horizontal pulse and a monostable multivibrator for causing the leading edge of said delayed line signal to substantially coincide in time with a second horizontal pulse.

10. The device of claim 9 wherein said device includes means for causing said marker signal to manifest two adjacent scan lines having corresponding times of occurrence in a video display of a frame, said trigger signal corresponding to said two adjacent scan lines.

11. A method of identifying a portion of a raster scan video display comprising:
generating a marker signal having a time duration of said portion of said raster scan; and
displacing said marker signal in time concurrence with said portion of said raster scan.

12. The method of claim 11 wherein said video signal has successive horizontal synchronization pulses adjacent ones of which manifesting a scan line, said portion comprising at least one selected scan line of a given duration, said method including generating a marker reference signal of different time duration than that of said selected scan line and causing said reference signal to terminate at leading and trailing edges thereof in time coincidence with adjacent horizontal synchronization pulses of said video signal corresponding to the selected scan line.

13. The method of claim 11 wherein said marker line signal has leading and trailing edges, said method further including generating an oscilloscope trigger signal in time coincidence with at least one of the leading and trailing edges.

14. The method of claim 11 including generating an oscilloscope trigger signal in time coincidence with an edge of said portion.

15. The method of claim 14 including combining the reference marker signal with the video signal to mark the selected portion of the video signal, applying said trigger signal to the trigger input of an oscilloscope while applying said video signal to the test inputs of said oscilloscope and displaying said combined video signal on a raster scan display.

16. A device for generating an oscilloscope trigger signal for selecting and identifying a video raster scan line in a raster scan video display comprising:
means for generating a marker line signal having a time duration of at least one raster scan line of said video signal;
means for causing said line signal to be in time concurrence with a selected video scan line on a video display; and
means for generating said trigger signal such that the trigger signal manifests the time of occurrence of said marker signal.

17. The device of claim 16 wherein said means for generating said trigger signal includes means for generating an oscilloscope trigger signal in time coincidence with said marker line signal.

18. The device of claim 16 wherein said video signal has vertical and horizontal synchronization pulses, said device including means responsive to said vertical pulses for generating a delayed marker signal of duration different than that of a selected scan line and means responsive to adjacent horizontal pulses for causing the delayed marker signal to have a time duration that is the same as and in time coincidence with the selected video scan line.

19. The device of claim 16 wherein said means for generating said trigger signal comprises means for inverting said marker line signal to produce said trigger signal.

20. A device for generating an oscilloscope trigger signal for at least one selected video raster scan line in a raster scan video signal comprising:
means for generating a marker line signal having a time duration of a raster scan line of said video signal comprising:
means for separating the vertical synchronization pulses from said video signal;
means responsive to the separated vertical pulses for producing a delayed scan line signal having a duration different than said at least one selected line signal;
means for forming a reference marker signal by causing said produced delayed scan line signal to coincide in time with at least one selected raster scan line; and
means for generating an oscilloscope trigger signal manifesting the time of occurrence of said selected scan line.

21. A device for generating an oscilloscope trigger signal for observing a selected video line of a plurality of raster scan lines of a video signal applied to said oscilloscope, each said lines having a given length defined by first and second horizontal synchronization (sync) pulses of said video signal, said device comprising:
means responsive to said video signal applied as an input thereto for generating a line marker signal corresponding to and manifesting the length and time of occurrence of the selected corresponding line; and
means responsive to said video signal applied as an input thereto for generating an oscilloscope trigger signal manifesting and in time coincidence with the time of occurrence of one of the horizontal sync pulses corresponding to said selected line.

* * * * *